United States Patent
Lee

(10) Patent No.: US 8,441,188 B2
(45) Date of Patent: May 14, 2013

(54) ORGANIC LIGHT EMITTING DIODE DISPLAY HAVING SUBSTRATE SPACERS OF DIFFERING HEIGHTS AND METHOD FOR MANUFACTURING THE SAME

(75) Inventor: Kyung-Jun Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 202 days.

(21) Appl. No.: 12/642,645

(22) Filed: Dec. 18, 2009

(65) Prior Publication Data

US 2010/0171416 A1 Jul. 8, 2010

(30) Foreign Application Priority Data

Jan. 7, 2009 (KR) .................. 10-2009-0001167

(51) Int. Cl.
*H01J 1/62* (2006.01)
(52) U.S. Cl.
USPC ............. 313/512; 313/507; 313/508; 445/24; 445/25
(58) Field of Classification Search .......... 313/498–512; 445/24–25
See application file for complete search history.

(56) References Cited

U.S. PATENT DOCUMENTS

| | | | |
|---|---|---|---|
| 2003/0067268 A1* | 4/2003 | Matsuoka | 313/512 |
| 2005/0170076 A1* | 8/2005 | Seki et al. | 427/66 |
| 2006/0103786 A1* | 5/2006 | Koma et al. | 349/107 |
| 2008/0036367 A1* | 2/2008 | Eida et al. | 313/504 |

FOREIGN PATENT DOCUMENTS

| | | |
|---|---|---|
| JP | 2007-042467 | 2/2007 |
| KR | 10-2004-0078037 A | 9/2004 |
| KR | 10-2004-0099748 A | 12/2004 |
| KR | 10-2006-0076479 A | 7/2006 |
| KR | 10-2007-0120315 A | 12/2007 |

OTHER PUBLICATIONS

Matsumoto, Hisaki, Japanese Patent Application Publication 2007-042467, Feb. 2007, machine translation.*

* cited by examiner

*Primary Examiner* — Tracie Y Green
(74) *Attorney, Agent, or Firm* — Knobbe, Martens, Olson & Bear LLP

(57) ABSTRACT

An organic light emitting diode display and a method for manufacturing the same are provided. The organic light emitting diode display includes a display substrate having an organic light emitting diode, an encapsulation substrate arranged opposite to the display substrate, and a sealant is applied between the display substrate and the encapsulation substrate to bond and form a hermetically sealed enclosed space therein. A filler may also be provided in some of the enclosed space. Spacers are formed on at least one of the display substrate and the encapsulation substrate to maintain a predetermined gap between the display substrate and the encapsulation substrate. The heights of the spacers are gradually increased from a central portion of the display substrate toward edges of the display substrate.

12 Claims, 6 Drawing Sheets

ORGANIC LIGHT EMITTING DIODE DISPLAY HAVING SUBSTRATE SPACERS OF DIFFERING HEIGHTS AND METHOD FOR MANUFACTURING THE SAME

CROSS-REFERENCE TO RELATED APPLICATION

This application claims priority to and the benefit of Korean Patent Application No. 10-2009-0001167 filed in the Korean Intellectual Property Office on Jan. 7, 2009, the entire contents of which are incorporated herein by reference.

BACKGROUND OF THE INVENTION

1. Field of the Invention

The present disclosure relates to an organic light emitting diode (OLED) display. More particularly, the present disclosure relates to an OLED that is designed to improve durability and reduce defects.

2. Description of the Related Technology

An organic light emitting diode (OLED) display is self-emissive type of display. Unlike a liquid crystal display (LCD), an OLED display does not need a separate light source. Thus, an OLED display can be reduced in thickness and weight compared to a LCD. In addition, since the OLED display has high-quality characteristics, such as low power consumption, high luminance, fast reaction, and the like, the OLED display is drawing interest for various display devices.

Generally, an OLED display includes a display substrate having an OLED, an encapsulation substrate that is arranged opposite to the display substrate to protect the OLED, and a sealant that adheres and seals the display substrate and the encapsulation substrate to each other. Since the space between the display substrate and the encapsulation substrate can include some empty space, the mechanical strength of the OLED display can be weak in certain areas. In order to address the problem, the empty space between the display substrate and the encapsulation substrate is often filled with a filler material through a vacuum bonding process to improve durability, for example, against an external impact on the OLED device.

However, when the space between the display substrate and the encapsulation substrate is filled with the filler, the filler can contact the sealant formed near the edges of the display and encapsulation substrates. In some cases, the filler can hinder the mechanical strength of the device and may cause cracks during hardening of the sealant. Therefore, the sealant cannot stably seal and bond the display substrate and the encapsulation substrate.

The above information disclosed in this Background section is only for enhancement of understanding of the background of the invention and therefore it may contain information that does not form the prior art that is already known in this country to a person of ordinary skill in the art.

SUMMARY

The present disclosure provides various embodiments of an organic light emitting diode display (OLED) having advantages of improving durability and suppressing a defect. In addition, the present invention also provides a method for manufacturing the OLED display.

In some embodiments, the organic light emitting diode display includes a display substrate, an encapsulation substrate arranged opposite to the display substrate, at least one organic light emitting diode interposed between the display and encapsulation substrates, a sealant interconnecting the display substrate and the encapsulation substrate while surrounding the at least one diode such that the sealant, the display substrate, and the encapsulation substrate form an enclosed space therein. A plurality of spacers are formed on at least one of the display substrate and the encapsulation substrate and configured to maintain a predetermined gap between the display substrate and the encapsulation substrate within the enclosed space. The heights of the plurality of spacers are gradually increased from a central portion of the display substrate toward edges of the display substrate, and a filler is configured to fill at least some of the enclosed space.

In some embodiments of the organic light emitting diode display, a height of at least one spacer with lowest height is from about ½ to about ⅘ of a height of a spacer with highest height. The spacer with the lowest height may be located in a central portion of the display substrate and the spacer with highest height is located near the edge of the display substrate. In one embodiment, the sealant is arranged along edges of the display and encapsulation substrates, and the heights of the plurality of spacers are gradually reduced as they go away from the sealant toward the central portion of the display substrate. In one embodiment, lengths of the plurality of spacers are gradually increased from the central portion of the display substrate toward the edges of the display substrate. In one embodiment, widths of the plurality of spacers are gradually increased from the central portion of the display substrate toward the edges of the display substrate. In one embodiment, gaps between the spacers are gradually reduced from the central portion of the display substrate toward the edges of the display substrate.

In one embodiment, the plurality of spacers are formed in a bar shape extending along the display substrate. In another embodiment, the spacers are formed in a cross shape extending along the display substrate. In another embodiment, the spacers are formed along a plurality of rectangular outlines on the display substrate having a common center and surrounding predetermined regions of the display substrate. The sides of the plurality of outlines are parallel with respective edges of the display substrate and some portion of at least one of the sides of each of the plurality of spacers are cut away.

Some embodiments of the disclosure provide a method of manufacturing an organic light emitting diode display, wherein the method includes forming a plurality of spacers on at least one of a display substrate or an encapsulation substrate. The heights of the spacers are gradually increased from a central portion of the display substrate to an edge of the display substrate. A sealant is applied on at least one of edges of the display substrate. A filler is applied by drops on the display substrate and the display substrate is joined with the encapsulation substrate so that the filler is interposed between the display substrate and the encapsulation substrate. The display substrate is bonded with the encapsulation substrate via the sealant, wherein hardening of the sealant bonds the display substrate with the encapsulation substrate.

In some embodiments of the method, the spacers are configured to control the flow of the filler so that contacting of the filler with the sealant is retarded substantially until the sealant is sufficiently hardened. The height of a spacer with the lowest height is about ½ to about ⅘ of a height of a spacer with the highest height. In one embodiment of the method, the display substrate is adhered to the encapsulation substrate through a vacuum bonding process.

BRIEF DESCRIPTION OF THE DRAWINGS

Embodiments of the present invention will be described more fully hereinafter with reference to the accompanying drawings, in which exemplary embodiments of the invention are shown.

DETAILED DESCRIPTION

Figure 1:
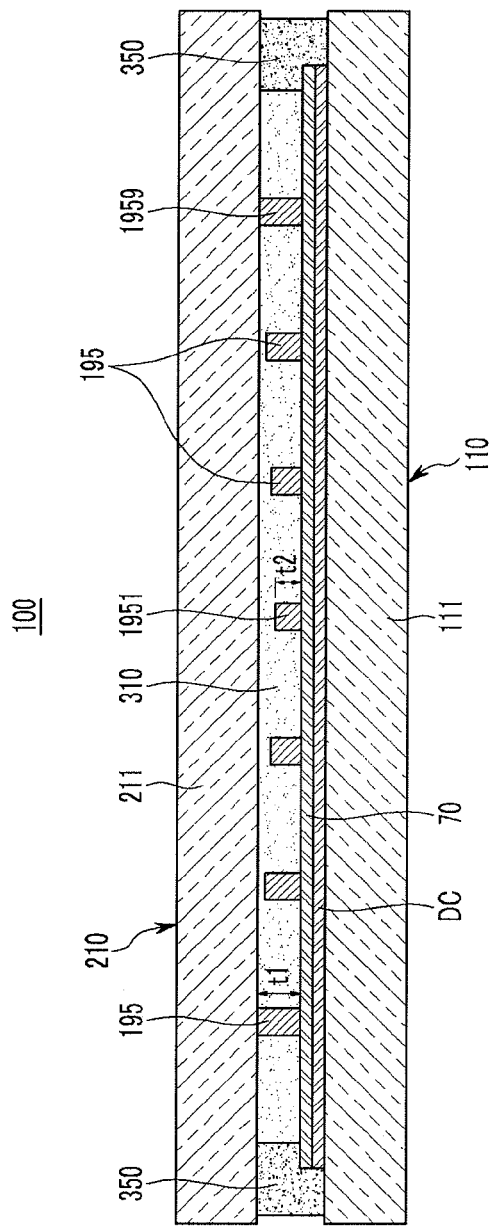
FIG. 1 is a cross-sectional view of an OLED display according to an embodiment of the present disclosure.

As those skilled in the art would realize, the described embodiments may be modified in various different ways, all without departing from the spirit or scope of the present invention. In addition, when describing a variety of exemplary embodiments, like reference numerals designate like elements that will be described in a first exemplary embodiment. Therefore, in other exemplary embodiments, only different elements will be described. Accordingly, the drawings and description are to be regarded as illustrative in nature and not restrictive. Like reference numerals designate like elements throughout the specification.

In order to clarify layers and regions, thicknesses and sizes thereof are exemplarily illustrated and thus the present invention is not limited thereto. In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, although an active matrix type OLED display of a 2Tr-1Cap structure in which one pixel has two thin film transistors and one capacitor is illustrated in the accompanying drawings, the present invention is not limited thereto. Therefore, the OLED display may be formed with pixels each having three or more thin film transistors and two or more capacitors. In addition, the OLED display may be formed in a variety of structure by adding additional metal lines. Here, the pixel is a minimum unit that can display an image, and the OLED display displays an image using a plurality of the pixels.

Figure 2:
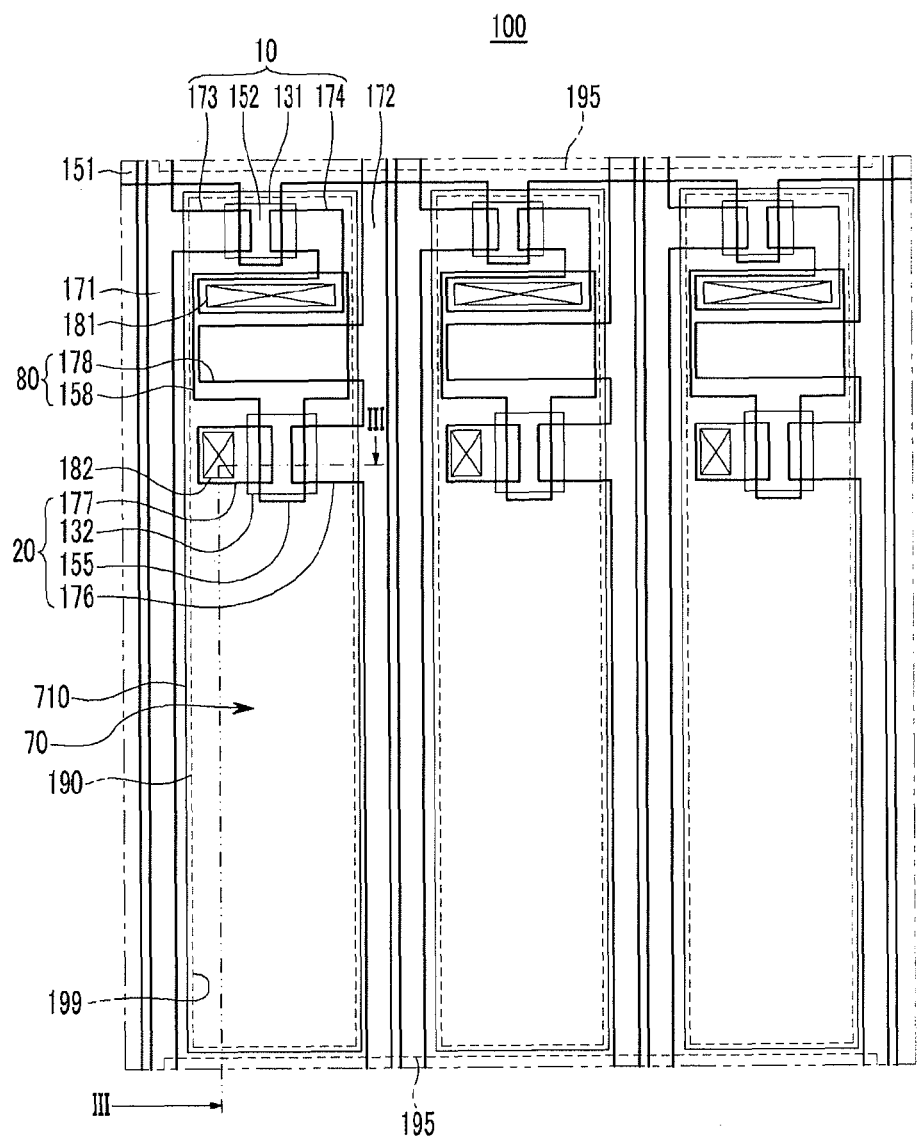
FIG. 2 is a layout view illustrating an internal structure of a display substrate of FIG. 1.
Figure 3:
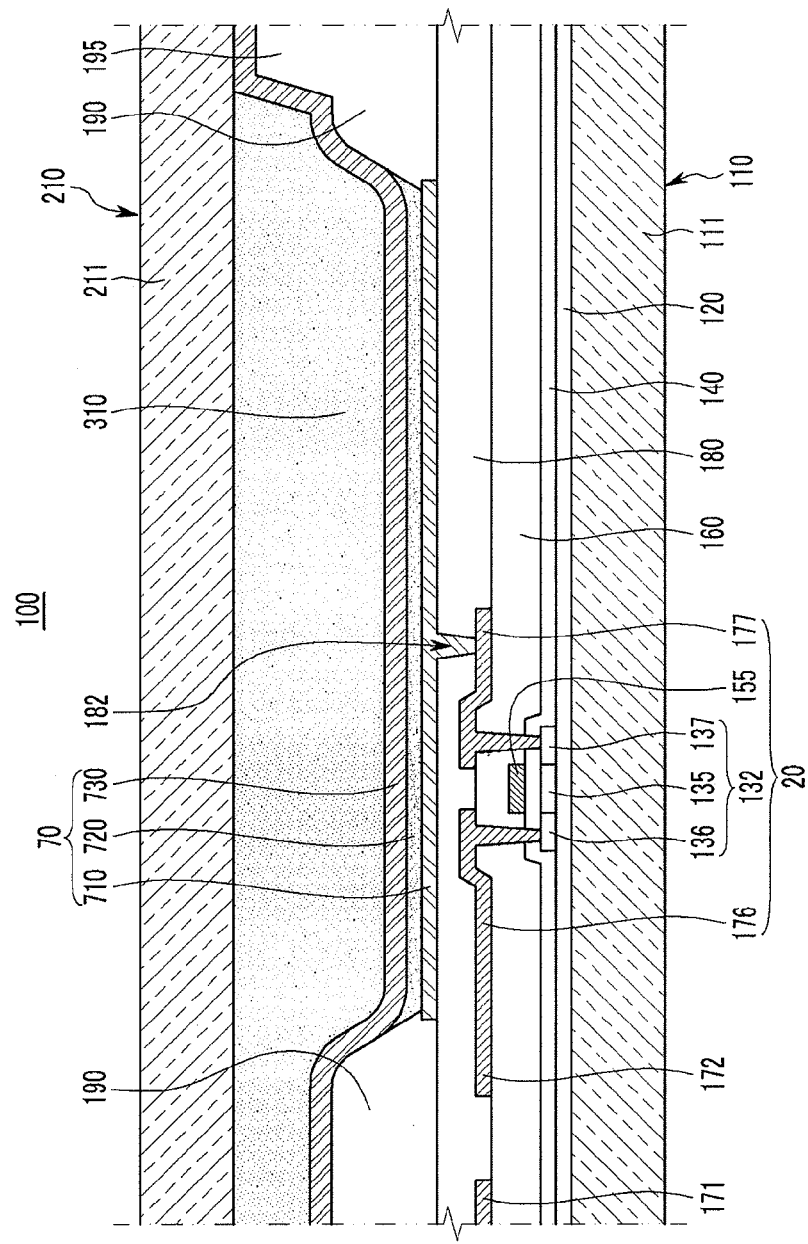
FIG. 3 is a cross-sectional view taken along line of FIG. 2.

FIG. 1 shows a cross-sectional view of an OLED display according to an embodiment of the present disclosure. FIG. 2 shows a layout view illustrating an internal structure of a display substrate of FIG. 1. And, FIG. 3 shows a cross-sectional view taken along line III-III of FIG. 2.

A general structure of an OLED display 100 of the present disclosure will now be described. In the illustrated embodiment of an OLED display shown in FIG. 1, an OLED display 100 includes a display substrate 110, an encapsulation substrate 210, a sealant 350, a filler 310, and a plurality of spacers 195.

The display substrate 110 includes a first substrate member 111, an OLED 70, and driving circuit DC that are formed on the first substrate member 111. In one embodiment, the OLED 70 are formed on the display substrate 110. The encapsulation substrate 210 can be arranged so that it encloses the OLED 70 and driving circuit DC of the display substrate 110. The sealant 350 is arranged along and near edges of the display substrate 110 and/or the encapsulation substrate 210 to seal and bond the display substrate 110 and encapsulation substrate 210.

The filler 310 fills at least some of the enclosed space formed by the display substrate 110, the encapsulation substrate 210, and the sealant 350. The filler 310 is configured to enhance the mechanical strength of the OLED display 100 by filling the enclosed space. That is, the filler 310 improves durability against external impact by filling the empty space in the OLED display 100.

The spacers 195 are formed on at least one of the display substrate 110 or the encapsulation substrate 210 to maintain a gap between the display substrate 110 and the encapsulation substrate 210. Although the spacers 195 can be formed on the display substrate 110 as in FIG. 1, the embodiment of the present disclosure is not limited to this configuration. In one embodiment, heights of the spacers 195 are gradually increased toward edges of the display substrate 110 and/or the encapsulation substrate 210. Or alternatively, the heights of the spacers 195 are gradually reduced toward a central portion of the display substrate 110.

For example, the height of a spacer 1959 closest to the sealant 350 is highest and the height of a spacer 1951 closest to the central portion of the display substrate 110 is lowest. In one embodiment, the lowest spacer 1951 has a height t2 that is from about ½ to about ⅘ of the height t1 of the highest spacer 1959. That is, the spacer 1951 arranged at the central portion of the display substrate 110 has a height that is less than from about ⅕ to about ½ of the height of the spacer 1959 at about one of the edges of the display substrate 110.

The spacers 195 may be arranged as described above to maintain the gap between the display substrate 110 and the encapsulation substrate 210. In addition, the spacers 195 prevent the filler 310 from hindering the hardening of the sealant 350 by controlling diffusion and flow of the filler 310 during a manufacturing process of the OLED display 100.

Some embodiments of a method of manufacturing the OLED display 100 will now be described also with reference to FIG. 1. In the following description, a process for injecting the filler 310 will also be described. First, one or more spacers 195 are formed on one of the display substrate 110 and the encapsulation substrate 210. In one embodiment, the spacers 195 are formed on the display substrate 110.

Next, the sealant 350 is applied on at least one of the edges of the display substrate 110 and the encapsulation substrate 210. Further, the filler 310 is applied in drops on the substrate 110 or 210 on which the sealant is applied. At this point, the filler 310 is initially in a liquid form and can be applied in drops starting from the central portion of the substrate 110 or 210 on which the sealant is applied.

Next, the display substrate 110 is coupled to the encapsulation substrate 210 with the sealant 350 and the filler 310 interposed between the display substrate 110 and the encapsulation substrate 210. Next, the sealant 350 is allowed to harden (passively or with the application of heat) so that the display substrate 110 is bonded to the encapsulation substrate 210 via the sealant 350.

In the above-described numerical value range, some embodiments of the OLED display have the effect that contacting of the filler 310 with the sealant 350 is retarded until the sealant 350 is sufficiently hardened, as the spacers 195 control and inhibit the flow of the filler 310. That is, the spacers 195 are configured to control diffusion and flow of the filler 310 toward the sealant 350 during the process of manufacturing the OLED display 100. Accordingly, the sealant 350 is stably hardened to adhere and seal the display substrate 110 and the encapsulation substrate 210 to each other.

In some embodiments, it is sufficient that the spacers 195 function only to prevent the display substrate 110 and the encapsulation substrate 210 from contacting each other. That is, the spacers 195 can be arranged in such a way that the display substrate 110 is spaced apart from the encapsulation substrate 210 throughout the entire substrate. Thus, the spacers 195 can prevent damage or defects of the OLED 70 on the display substrate 110 caused by contact of the filler with the display substrate 110 with the encapsulation substrate 210.

With the above-described structure, the durability of the OLED display 100 against the external impact can be improved and the generation of the sealing defect can also be suppressed. Some embodiments of an internal structure of the OLED display 100 will now be described with reference to FIGS. 2 and 3.

As shown in FIGS. 2 and 3, the display substrate 110 includes a plurality of pixels each having a switching thin film transistor 10, a driving thin film transistor 20, a capacitor 80, and the OLED 70. The display substrate 110 further includes gate lines 151 extending in a direction, data lines 171, and common power lines 172. The data lines 171 and common power line 172 can intersect the gate lines 151 and are insulated from the gate lines 151. Here, each pixel may be divided and defined by the gate, data, and common power lines 151, 171, and 172. However, the pixels are not limited to the above-described configuration.

In one embodiment, the OLED 70 includes a pixel electrode 710, an organic emission layer 720 formed on the pixel electrode 710, and a common electrode 730 formed on the organic emission layer 720. Here, the pixel electrode 710 is an anode that is a hole-injection electrode and the common electrode 730 is a cathode that is an electron-injection electrode. However, embodiments of the present disclosure are not limited to this configuration.

For example, in accordance with a driving method of the OLED display 100, the pixel electrode 710 may be the cathode and the common electrode 730 may be the anode. The holes and electrons can be injected from the respective pixel and common electrodes 710 and 730 into the organic emission layer 720.

Light emission is realized when excitons generated by the combination of the electrons and holes in the organic emission layer 720 fall from an excited state to a ground state. In addition, the OLED 70 can display the image by emitting light from the organic emission layer 720 in an opposite direction to the pixel electrode 710, i.e., in a direction toward the common electrode 730. In this embodiment, the OLED display 100 is a front emitting type of OLED display.

In one embodiment, the capacitor 80 includes first and second capacitor plates 158 and 178 formed between where a gate dielectric 140 is disposed. Here, the gate dielectric 140 is formed of a dielectric material. A capacitance of the capacitor 80 is determined by charges accumulated in the capacitor 80 and the voltage between the capacitor plates 158 and 178.

In one embodiment, the switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. The switching thin film transistor 10 functions as a switching element for selecting a pixel that will emit light. The switching gate electrode 152 is connected to the gate line 151. The switching source electrode 173 is connected to the data line 171. The switching drain electrode 174 is spaced apart from the switching source electrode 173 and connected to the first capacitor plate 158. The driving thin film transistor 20 applies driving power to the pixel electrode 710 to emit the light from the organic emission layer 720 of the OLED 70 in the selected pixel. The driving gate electrode 155 is connected to the first capacitor plate 158. The driving source electrode 176 and the second capacitor plate 178 are connected to the common power line 172. The driving drain electrode 177 is connected to the pixel electrode 710 of the OLED 70 through a contact hole 182.

With the above-described structure, the switching thin film transistor 10 is driven by a gate voltage applied to the gate line 151 to transfer a data voltage applied to the data line 171 to the driving thin film transistor 20. A voltage corresponding to a difference between the common voltage applied from the common power line 172 to the driving thin film transistor 20 and the data voltage transferred from the switching thin film transistor 10 is stored in the capacitor 80. A current corresponding to the voltage stored in the capacitor 80 flows to the OLED 70 through the driving thin film transistor 20 so that the OLED 70 emits light.

Some embodiments of the OLED display 100 will now be described in more detail in accordance with a stacking order from bottom to top with reference to FIGS. 2 and 3. For example, a structure of the thin film transistor will be described in more detail with reference to the driving thin film transistor 20. In addition, differences between the switching thin film transistor 10 from the driving thin film transistor 20 will also be described.

In one embodiment, the first substrate member 111 of the display substrate 110 is a dielectric substrate that is formed of glass, quartz, ceramic, or plastic. However, the present disclosure is not limited to these materials. For example, the first substrate member 111 may be a metal substrate formed of stainless steel.

A buffer layer 120 is formed on the first substrate member 111. The buffer layer 120 is configured to prevent infiltration of impurity elements and planarize a surface of the first substrate member 111. The buffer layer 120 may be formed of a variety of materials. For example, the buffer layer 120 may be formed of one of SiNx, $SiO_2$, and SiOxNy. However in some embodiments, the buffer layer 120 may not be necessarily required. That is, the buffer layer 120 may be omitted in accordance with the type of the first substrate member 111 and process conditions.

In one embodiment, the driving thin film transistor 20 is formed on the buffer layer 120. In one embodiment, a p-channel metal-oxide semiconductor (PMOS) using p-type impurities can be used as the driving thin film transistor 20. However, the present disclosure is not limited to this configuration. That is, an n-channel metal-oxide semiconductor (NMOS) or a complementary metal-oxide semiconductor (CMOS) may be used as the driving thin film transistor 20. In addition, although the driving thin film transistor 20 illustrated in FIG. 2 is a polycrystalline thin film transistor having a polycrystalline silicon layer, the switching thin film transistor 10 may be different types, such as a polycrystalline thin film transistor or an amorphous thin film transistor having an amorphous silicon layer.

In one embodiment, the driving thin film transistor 20 includes a driving semiconductor layer 132, a gate dielectric 140, a driving gate electrode 155, an interlayer dielectric 160, a driving source electrode 176, and a driving drain electrode 177. The driving thin film transistor 20 is not limited to the above-described structure. That is, it will be possible for those skilled in the art to make various modifications and variations to this structure.

The driving semiconductor layer 132 is formed on the buffer layer 120. The driving semiconductor layer 132 can be formed of polysilicon. In addition, the driving semiconductor layer 132 includes a channel region 135 in which no impurity is doped, and source and drain regions 136 and 137 that are doped with p+ ions and formed at respective sides of the channel region 135. The ion material doped in the source and drain regions 136 and 137 is a P-type impurity such as boron (B), for example $B_2H_6$. Here, the impurities may be varied depending on the type of thin film transistor.

The gate dielectric 140 formed of SiNx or $SiO_2$ for example, is formed on the driving semiconductor layer 132. A gate metal line including the driving gate electrode 155 is formed on the gate dielectric 140. The gate metal line 151 (see FIG. 1) further includes the first capacitor plate 158 and other metal lines. Further, the driving gate electrode 155 is formed such that it overlaps at least a portion of the driving semiconductor layer 132, particularly, the channel region 135.

The interlayer dielectric 160 covering the driving gate electrode 155 is formed on the gate dielectric 140. The gate dielectric 140 and the interlayer dielectric 160 are provided with through holes exposing the source and drain regions 136 and 137 of the driving semiconductor layer 132. Like the gate dielectric 140, the interlayer dielectric 160 can be formed of SiNx or SiOx.

Data metal lines including the driving source electrode 176 and the driving drain electrode 177 are formed on the interlayer dielectric 160. The data metal lines further comprise the data line 171, the common power lines 172, and a second capacitor plate 178. In addition, the driving source electrode 176 and the driving drain electrode 177 are respectively connected to the source and drain regions 136 and 137 of the driving semiconductor layer 132 through the respective through holes.

In one embodiment, a planarization layer 180 over the driving thin film transistor 20 covering the data metal lines 172, 176, 177, and 178 is formed on the interlayer dielectric 160. The planarization layer 180 functions to eliminate steps that were previously required in the conventional technology. In addition, the planarization layer 180 planarizes a surface, and thus, improves the luminous efficiency of the OLED 70. The planarization layer 180 is provided with a contact hole for partly exposing the drain electrode 177. The planarization layer 180 may be formed of at least one of a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB). Embodiments of the present disclosure are not limited to the above-described configurations. For example, if necessary, one of the planarization layer 180 and the interlayer dielectric 160 may be omitted.

In some embodiments, the OLED 70 includes a pixel electrode 710, an organic emission layer 720, and a common electrode 730. The plurality of spacers 195 can be formed between the planarization layer 180 and these components of the OLED 70. The pixel electrode 710 of the OLED 70 can be formed on the planarization layer 180. That is, the OLED display 100 includes a plurality of pixel electrodes 710 that are arranged on each of the plurality of respective pixels. At this point, the pixel electrodes 710 are spaced apart from each other. The pixel electrode 710 is connected to the drain electrode 177 through the contact hole 182 of the planarization layer 180.

In addition, a pixel defining layer 190 is provided with a plurality of openings 199 exposing the respective pixel electrodes 710 formed on the planarization layer 180. That is, the openings 199 of the pixel defining layer 190 are formed to correspond to the respective pixels. In addition, the pixel electrodes 710 are arranged to correspond to the respective openings 199 of the pixel defining layer 190. However, the pixel electrodes 710 are not necessarily arranged in the openings 199 of the pixel defining layer 190. That is, the pixel electrodes 710 may be arranged under the pixel defining layer 190 such that a portion of each of the pixel electrodes 710 overlaps the pixel defining layer 190. A portion where the pixel defining layer 190 is formed substantially becomes a non-emission region, and a portion where the openings 199 of the pixel defining layer 190 are formed substantially becomes an emission region.

In one embodiment, the spacers 195 are formed on the pixel defining layer 190. That is, the spacers 195 are formed at the non-emission region. The spacers 195 are configured to prevent the display substrate 110 and the encapsulation substrate 210 from contacting each other by maintaining a predetermined gap between the display substrate 110 and the encapsulation substrate 210.

The heights of the spacers 195 are gradually increased toward the edges of the display substrate 110 from about the central portion of the display substrate 110. In addition, the spacer 1951 arranged at about the central portion of the display substrate 110 has a height that is less than from about ⅕ to about ½ of the height of the spacer 1959 arranged at about the edge of the display substrate 110.

In one embodiment, the pixel defining layer 190 and the spacers 195 may be formed of a polyacrylate resin, a polyimide resin, or a silica-based inorganic material. The pixel defining layer 190 and the spacers 195 may be integrally formed with each other through a photolithography process or a photo-etching process. That is, the pixel defining layer 190 and the spacers 195 can be formed together by adjusting an exposure value through a halftone exposing process. However, the embodiments of the present disclosure are not limited to this process. That is, the pixel defining layer 190 and the spacers 195 may be separately formed and may be formed of different materials.

The organic emission layer 720 is formed on the pixel electrode 710. The common electrode 730 is formed on the pixel defining layer 190 and the organic emission layer 720. As described above, the OLED 70 including the pixel electrode 710, the organic emission layer 720, and the common electrode 730 can be formed. The organic emission layer 720 can emit light in a state where it is arranged between the pixel electrode 710 and the common electrode 730 in the opening 199 of the pixel defining layer 190. In addition, the common electrode 730 is formed on the organic emission layer 720, the pixel defining layer 190, and the spacers 195. The organic emission layer 720 may be formed of a low or high molecular weight organic material. The organic emission layer 720 is a multilayer having a hole-injection layer (HIL), a hole-transporting layer (HTL), an emission layer, an electron-transporting layer (ETL), an electron-injection layer (EIL), and the like. When the organic emission layer 720 includes all of the layers, the HIL is disposed on the pixel electrode 710 that is an anode, and the HTL, emission layer, ETL, and EIL are sequentially stacked on the HIL.

In addition, although the organic emission layer 720 is disposed only in the opening 199 of the pixel defining layer 190 as shown in FIG. 3, embodiments of the present disclosure are not limited thereto. For example, the organic emission layer 720 may be arranged not only on the pixel electrode 190 in the opening 199 of the pixel defining layer 190 but also between the pixel defining layer 190 and the common electrode 730. In more detail, like the common electrode 730, the HIL, HTL, ETL, and EIL among the layers of the organic emission layer 720 may be formed not only on the pixel defining layer 190 but also on the pixel electrode. That is, at least one of the layers of the organic emission layer 720 may be arranged between the pixel defining layer 190 and the common electrode 730. The pixel electrode 710 and the common electrode 730 may be formed of a transparent conductive material or a translucent or reflective conductive material. The OLED display may be a front emitting type of OLED display, a rear emitting type of OLED display, or a both-side emitting type of OLED display depending on the materials of the pixel electrode 710 and the common electrode 730.

In some embodiments, the OLED display 100 of the present disclosure is a front emitting type OLED display. That is, the OLED 70 emits the light toward the encapsulation substrate 210 to display an image. Indium tin oxide (ITO), indium zinc oxide (IZO), zinc oxide (ZnO), or indium oxide ($In_2O_3$) may be used as the transparent conductive material. Lithium (Li), calcium (Ca), fluoridation lithium/aluminum (LiF/Al), aluminum (Al), silver (Ag), magnesium (Mg), or gold (Au) may be used as the reflective material.

In one embodiment, the encapsulation substrate 210 is arranged above the common electrode 730. That is, the encapsulation substrate 210 is arranged opposite to the display substrate 110 to enclose the thin film transistors 10 and 20, the capacitor 80, and the OLED 70. The encapsulation substrate 210 comprises a second substrate member 211. The display substrate 110 and the encapsulation substrate 210 are bonded with each other by the sealant 350 arranged along near the edges of the display substrate 110 and the encapsulation substrate 210. With the above-described structure, the durability of the OLED display 100 against the external impact can be improved and the generation of the sealing defect can be substantially suppressed.

Figure 4:
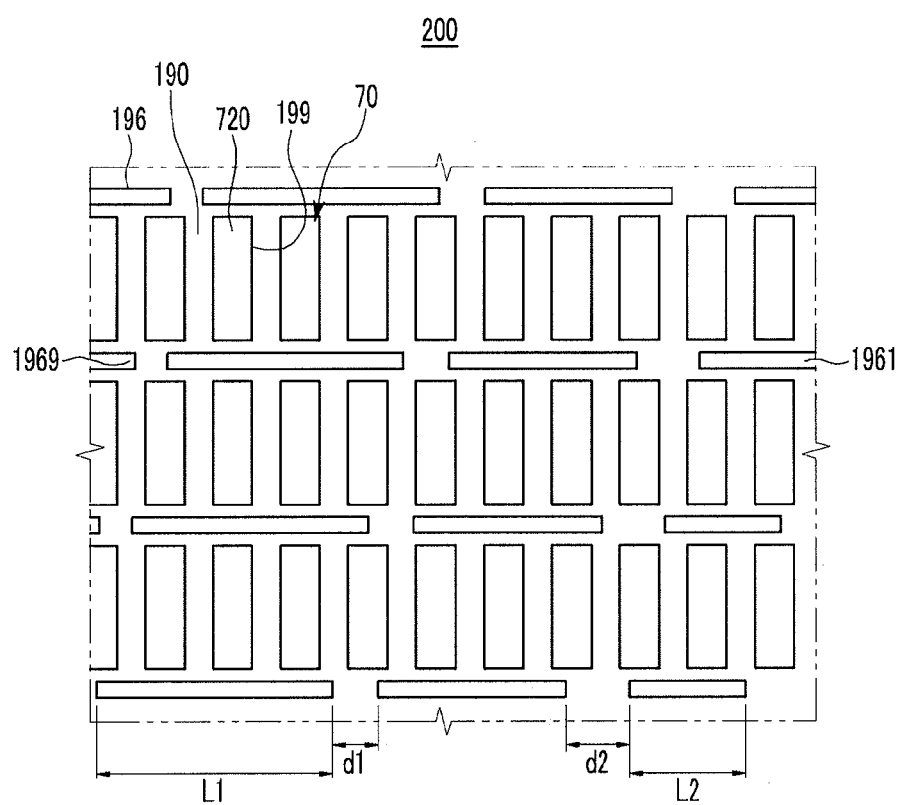
FIG. 4 is a partial top, plan view of an OLED display according to an embodiment of the present disclosure.

Some embodiments of the present disclosure will now be described with reference to FIG. 4. As shown, FIG. 4 is a top, plan view illustrating an arrangement and/or configuration of spacers 196 formed on the pixel defining layer 190. In FIG. 4, the left side is close to an edge of a display substrate 110 (e.g., see also FIG. 1) and the right side is close to a central portion of the display substrate 110.

As shown in FIG. 4, a length L1 of the spacers 196 arranged close to the edge of the display substrate 110 is relatively long and a length L2 of the spacers 196 arranged close to the central portion of the display substrate 110 is relatively short. That is, the spacer 1969 arranged close to the edge of the display substrate 110 is longer than the spacer 1961 arranged close to the central portion of the display substrate 110.

In addition, a gap d1 between the spacers 196 arranged close to the edge of the display substrate 110 is relatively narrow and a gap d2 between the spacers 196 arranged closed to the central portion of the display substrate 110 is relatively wide. Further, although widths of the spacers 196 are similar to each other in FIG. 4, embodiments of the present disclosure are not limited to this. For example, widths of the spacers 196 may be gradually increased toward the edge of the display substrate 110 and gradually reduced toward the central portion of the display substrate 110.

In the illustrated embodiment of the OLED display 200 shown in FIG. 4, the spacers 196 are designed to meet at least one of conditions of the length, width, and gap as described above. Further, like in FIG. 1, the heights of the spacers 196 are gradually increased toward the edge of the display substrate 110 and gradually reduced toward the central portion of the display substrate 110.

In one embodiment, the spacers 196 may be formed in a bar shape along the display substrate 110 in the OLED display 200 as shown in a top, plan view of FIG. 4. The spacers 196 are formed on the pixel defining layer 190 between the openings 199 of the pixel defining layer 190. Further, the organic emission layer 720 emits light in the opening 199 of the pixel defining layer 190.

With the above-described embodiment, the durability of the OLED display 200 against external impact can be improved and the generation of sealing defects can be substantially suppressed. That is, the spacers 196 arranged as described above maintain the gap between the display substrate 110 and the encapsulation substrate 210 and prevent the filler 310 from having a negative influence on a process for hardening the sealant 350 by controlling diffusion and flow of the filler 310 during a process for manufacturing the OLED display 200. In addition, the spacers 196 are configured to prevent damage or defects of the OLED 70 on the display substrate 110, which can be caused by contacting of the display substrate 110 with the encapsulation substrate 210.

Figure 5:
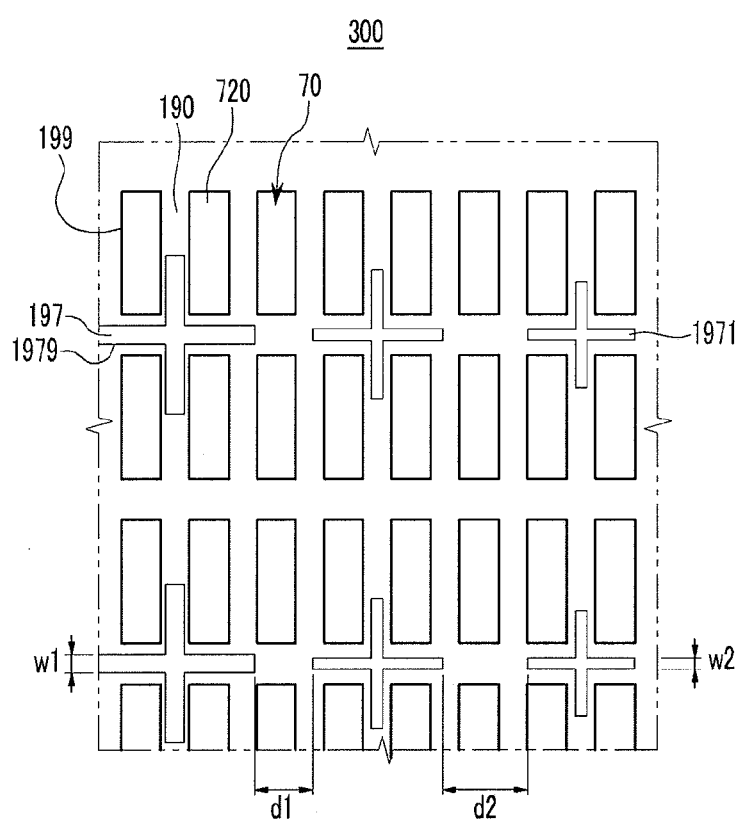
FIG. 5 is a partial top, plan view of an OLED display according to an embodiment of the present disclosure.

Some embodiments will now be described with reference to FIG. 5. As shown, FIG. 5 is a top, plan view illustrating an arrangement of spacers 197 formed on a pixel defining layer 190. In FIG. 5, the left side is close to an edge of a display substrate 110 (e.g., see also FIG. 1) and the right side is close to a central portion of the display substrate 110.

As shown in FIG. 5, sizes of the spacers 197 are gradually increased toward the edge of the display substrate 110. Or alternatively, the heights of the spacers 197 are gradually reduced toward the central portion of the display substrate 110 in this top, plan view. For example, the spacer 1979 arranged close to the edge of the display substrate has a greater size than the spacer 1971 arranged close to the central portion of the display substrate 110.

In addition, a width w1 of the spacers 197 arranged close to the edge of the display substrate 110 is relatively wide and a width w2 of the spacers 197 arranged close to the central portion of the display substrate 110 is relatively narrow. Furthermore, a gap d1 between the spacers 197 arranged close to the edge of the display substrate 110 is relatively narrow and a gap d2 between the spacers 197 arranged closed to the central portion of the display substrate 110 is relatively wide.

In the OLED display 300 shown in FIG. 5, the spacers 197 are designed to meet at least one of conditions of the length, width, and gap as described above. Further, like in FIG. 1, the heights of the spacers 197 are gradually increased toward the edge of the display substrate 110 and are gradually reduced toward the central portion of the display substrate 110.

In addition, in the illustrated embodiment of the OLED display 300 shown in FIG. 5, the spacers 197 may be formed in a cross shape along the display substrate 110. The spacers 197 are formed on the pixel defining layer 190 between the openings 199 of the pixel defining layer 190. Further, the organic emission layer 720 emits light in the opening 199 of the pixel defining layer 190.

With the above-described structure, the durability of the OLED display 300 against external impact can be improved and the generation of sealing defects can be substantially suppressed. That is, the spacers 197 arranged as described above are configured to maintain the gap between the display substrate 110 and the encapsulation substrate 210. The spacers 197 also prevent the filler 310 from having a negative influence during the process of hardening of the sealant 350 by controlling diffusion and flow of the filler. In addition, the spacers 197 are configured to prevent damage or defects of the OLED 70 on the display substrate 110, which can be caused by contacting of the display substrate 110 with the encapsulation substrate 210.

Figure 6:
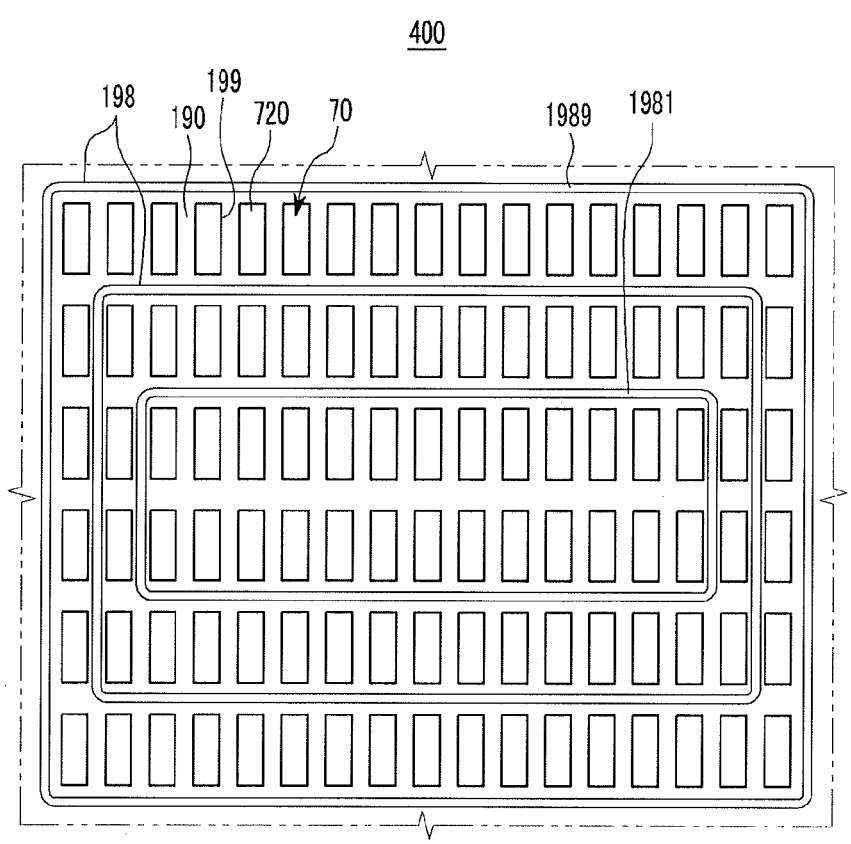
FIG. 6 is a partial top, plan view of an OLED display according to an embodiment of the present disclosure.

Some embodiments will now be described with reference to FIG. 6. As shown, FIG. 6 is a top, plan view illustrating an arrangement of spacers 198 formed on a pixel defining layer 190. In FIG. 6, a central portion of the drawing corresponds to the central portion of a display substrate 110 (e.g., see also FIG. 1). As shown in FIG. 6, the spacers 198 are formed along a plurality of rectangular outlines, wherein each outline surrounds a predetermined region of the display substrate and having a common center. That is, the spacer 1981 arranged close to the central portion of the display substrate 110 surrounds a relatively small region and the spacer 1989 arranged close to an edge of the display substrate 110 surrounds a relatively large region.

In one embodiment, each outline of the spacers 198 can run parallel with the edge of the display substrate 110. In some embodiments, one or more portions of the spacer 198 may be cut away. The flow of the filler 310 may be more effectively controlled by the cut-away sections of the spacer 198 during the application of the filler 310. Further, like in FIG. 1, heights of the spacers 198 can be gradually increased toward the edge of the display substrate 110 (or gradually reduced toward the central portion of the display substrate 110).

With the above-described embodiment, the durability of the OLED display 400 against external impact can be improved and the generation of sealing defects can be substantially suppressed. That is, the spacers 198 arranged as described above are configured to maintain the gap between the display substrate 110 and the encapsulation substrate 210 and prevent the filler 310 from having a negative influence on the hardening of the sealant 350 by controlling diffusion and flow of the filler 310 during. In addition, the spacers 198 are configured to prevent damage or defects of the OLED 70 and other components on the display substrate 110 by preventing contacting of the display substrate 110 with the encapsulation substrate 210.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
a display substrate;
an encapsulation substrate arranged opposite to the display substrate;
at least one organic light emitting diode interposed between the display and encapsulation substrates;
a sealant interconnecting the display substrate and the encapsulation substrate while surrounding the at least one diode such that the sealant, the display substrate, and the encapsulation substrate form an enclosed space therein;
a plurality of spacers that are formed in a central portion and in a peripheral portion of at least one of the display substrate and the encapsulation substrate and configured to maintain a predetermined gap between the display substrate and the encapsulation substrate within the enclosed space, wherein heights of the plurality of spacers correspond to a distance from the central portion of the display substrate, wherein the heights of the spacers in the central portion are less than the heights of the spacers in the peripheral portion of the display substrate; and a filler configured to fill at least some of the enclosed space, wherein the filler overlaps at least one of the spacers.

2. The organic light emitting diode display of claim 1, wherein a height of at least one spacer with lowest height is from about ½ to about ⅘ of a height of a spacer with highest height.

3. The organic light emitting diode display of claim 2, wherein the at least one spacer with lowest height is located at about the central portion of the display substrate and the spacer with highest height is located at about the edge of the display substrate.

4. The organic light emitting diode display of claim 1, wherein the plurality of spacers are formed in a bar shape extending along the display substrate.

5. The organic light emitting diode display of claim 1, wherein the plurality of spacers are formed in a cross shape extending along the display substrate.

6. A method of manufacturing an organic light emitting diode display, the method comprising:
forming a plurality of spacers in a central portion and in a peripheral portion of at least one of a display substrate or an encapsulation substrate, wherein heights of the spacers correspond to a distance from the central portion of the display substrate, wherein the heights of the spacers in the central portion are less than the heights of the spacers in the peripheral portion of the display substrate;
applying a sealant on at least one of edges of the display substrate;
applying a filler by drops on the display substrate;
joining the display substrate with the encapsulation substrate so that the filler is interposed between the display substrate and the encapsulation substrate, and overlaps at least one of the spacers; and
bonding the display substrate with the encapsulation substrate via the sealant, wherein hardening of the sealant bonds the display substrate with the encapsulation substrate.

7. The method of claim 6, wherein the plurality of spacers are configured to control the flow of the filler so that contacting of the filler with the sealant is retarded substantially until the sealant is sufficiently hardened.

8. The method of claim 7, wherein the display substrate is adhered to the encapsulation substrate through a vacuum bonding process.

9. The method of claim 7, wherein a height of a spacer with lowest height is from about ½ to about ⅘ of a height of a spacer with the highest height.

10. The method of claim 6, wherein the plurality of spacers are formed in at least one of a bar or a cross shape along the display substrate.

11. The organic light emitting diode display of claim 1, wherein additional spacers are formed between the central portion and the peripheral portion, and the heights of the additional spacers is greater than the height of the spacers in the central portion and is less than the height of the spacers in peripheral portion.

12. The method of claim 6, further comprising forming additional spacers between the central portion and the peripheral portion, wherein the heights of the additional spacers is greater than the height of the spacers in the central portion and is less than the height of the spacers in peripheral portion.

* * * * *